United States Patent [19]
Brandstetter et al.

[11] Patent Number: 4,906,069
[45] Date of Patent: Mar. 6, 1990

[54] OPTICAL SPREAD SPECTRUM DECODER

[75] Inventors: Robert W. Brandstetter, Levittown; Philip G. Grieve, New York; Nils J. Fonneland, Lake Ronkonkoma, all of N.Y.

[73] Assignee: Grumman Aerospace Corporation, Bethpage, N.Y.

[21] Appl. No.: 265,011

[22] Filed: Oct. 31, 1988

[51] Int. Cl.$^4$ ............................................. G02F 1/11
[52] U.S. Cl. ................................. 350/162.12; 350/358
[58] Field of Search ........................... 350/162.12, 358

[56] References Cited
U.S. PATENT DOCUMENTS

| | | | |
|---|---|---|---|
| 3,191,047 | 6/1965 | Oliver | 329/144 |
| 3,426,207 | 2/1969 | Fried et al. | 455/611 |
| 3,482,099 | 12/1969 | Goodwin | 455/611 |
| 3,483,386 | 12/1969 | Jernigan | 350/358 |
| 3,483,387 | 12/1969 | Davis | 350/358 |
| 3,530,298 | 9/1970 | Hubbard et al. | 455/608 |
| 3,544,795 | 12/1970 | Korpel | 350/358 |
| 3,668,405 | 6/1972 | Brooks et al. | 350/358 |
| 3,745,353 | 7/1973 | Jernigan et al. | 350/358 |
| 3,821,548 | 6/1974 | Jernigan | 350/358 |
| 3,862,413 | 1/1975 | Brienza | 455/611 |
| 3,870,414 | 3/1975 | Duffy | 350/162.12 |
| 3,884,546 | 5/1975 | Chu | 350/162.12 |
| 3,950,747 | 4/1976 | Waddoups | 350/162.12 |
| 4,016,563 | 4/1977 | Pedinoff | 350/358 |
| 4,105,953 | 8/1978 | Jernigan | 350/358 |
| 4,126,834 | 11/1978 | Coppock | 455/611 |
| 4,206,347 | 6/1980 | Avicola et al. | 455/608 |
| 4,271,413 | 6/1981 | Shreve | 350/162.12 |
| 4,331,877 | 5/1982 | Barrett et al. | 350/162.12 |
| 4,355,869 | 10/1982 | Yao | 350/358 |
| 4,365,310 | 12/1982 | Green | 350/358 |
| 4,448,494 | 5/1984 | Freyre | 350/358 |
| 4,522,466 | 6/1985 | Lindig | 350/162.12 |
| 4,579,421 | 4/1986 | Brown et al. | 350/162.12 |
| 4,679,048 | 7/1987 | Brandstetter et al. | 342/61 |
| 4,699,466 | 10/1987 | Brandstetter et al. | 350/162.12 |
| 4,729,632 | 3/1988 | Cohen | 350/162.12 |

Primary Examiner—Bruce Y. Arnold
Assistant Examiner—Terry S. Callaghan
Attorney, Agent, or Firm—Richard G. Geib; Daniel J. Tick; Bernard S. Hoffman

[57] ABSTRACT

The invention features an optical spread spectrum decoder wherein linear, non-linear, and discontinuous broadband RF signals can be optically decoded.

The system introduces a weighting function into a local oscillator beam, which is then combined with a laser beam which has been modulated with the RF signal, processed to remove unwanted spectral components and then compressed. The combined beams are then down-converted to recover the RF signal.

26 Claims, 2 Drawing Sheets

OPTICAL SPREAD SPECTRUM DECODER

FIELD OF THE INVENTION

The invention relates to the decoding of linear, non-linear and discontinuous spread spectrum RF signals by optical means. More particularly, the invention relates to an optical decoding system in which the signals are decoded by compression with sidelobe suppression by a programmable weighing function.

BACKGROUND OF THE INVENTION

It is known to process chirp RF signals by impressing them upon a laser beam using an acousto-optical modulator, and then optically processing the signal, utilizing adaptive techniques to operate at frequencies free of interference.

A system using adaptive spread spectrum technology is shown in U.S. Pat. No. 4,679,048, issued to R. W. Brandstetter et al on July 7, 1987 and assigned to a common assignee.

It is also known to optically process RF signals by optically notching unwanted spectral components from a laser beam modulated with the RF signal. Such a technique is illustrated in U.S. Pat. No. 4,522,466, issued to C. E. Lindig et al on June 11, 1985 and assigned to a common assignee.

The present invention features a novel optical processing of a broad band RF signal utilizing the optical notching technique depicted in U.S. Pat. No. 4,522,466.

The invention can also be used in any system where an RF chirp signal modulates a laser beam by means of an acousto-optic modulator. The present invention, therefore, could also be applied to the system shown in U.S. Pat. No. 4,679,048.

In this invention, the self-focusing optical properties of the general class of chirp signals emanating from an acousto-optic modulator as a modulated laser beam can be utilized to compress the chirp. The compressed chirp is then advantageously combined with a weighted local oscillator beam to accomplish the decoding process. The two beams, the chirp (signal) beam and the local oscillator beam with the weighting function impressed thereon, are combined and fed to a photomixer to obtain the decoded signal (compressed and weighted).

The weighting function can be utilized in the form of a programmable gradient density filter, which is modulated by a programmed noncoherent write-light source having a different wavelength than the laser beam.

In this fashion, nonlinear or discontinuous chirp signals can be decoded, thus providing a system which can adapt to changes in the chirp format in order to avoid interference.

BRIEF SUMMARY OF THE INVENTION

The invention features an optical spread spectrum decoding system for decoding linear, non-linear and discontinuous radio frequency signals. The system comprises a source of coherent collimated optical radiation which is beamed along a path containing an acousto-optical modulator. The modulator impresses a broadband radio frequency signal upon the beam of radiation. An optical processing means then removes unwanted spectral components from the beam. The beam is compressed and a weighting function is introduced into the beam to accommodate the decoding of the signal to changes in the modulated radiation.

The optical processing is accomplished by a Fourier transform lens dispsed along the optical path, followed by a programmable spatial filter, followed by an inverse Fourier transform lens.

The weighting function can be introduced into the beam in several ways.

If the RF signal is linear, the weighting function can be provided by a gradient density filter disposed in the optical path of a local oscillator beam. The oscillator beam is then combined with the processed and compressed signal beam and the combined beams are down-converted by a photomixer to recover the signal.

However, if the RF signal is non-linear or discontinuous, a programmable gradient density filter can be utilized to introduce a weighting function that will accommodate the decoding function to the non-linearity. The programmabel gradient density filter is disposed in the path of the local oscillator beam and a programmed non-coherent write-light source is combined with the local oscillator beam and passed through the gradient density filter. The weighting function introduced in this manner may, for example, be one of the following: a cosine squared, cosine squared with pedestal, hamming, or Gaussian functions. Other functions, if required, can be generated.

The gradient density filter material can be any one of the following: photochromic, liquid crystal, magnetic, optic or photorefractive materials.

Other weighting functions can be introduced into the system. For example, a weighting function can be introduced into the signal beam between the spatial filter and the inverse Fourier transform lens. A weighting function can also be placed between the inverse Fourier transform lens and the compressing lens. The weighting function can thus be introduced in transform-related optical and frequency planes.

BRIEF DESCRIPTION OF THE DRAWINGS

In order that the invention may be readily carried into effect, it will now be described with reference to the accompanying drawings, wherein:

FIG. 4 is a waveform diagram of a compressed decoded signal derived from the invention.

DETAILED DESCRIPTION OF PREFERRED EMBODIMENTS

Generally speaking, the invention pertains to an optical spread spectrum decoding system. More specifically, the system functions as an optical waveform decoder with programmable sidelobe weighing. The decoding system uniquely combines several different techniques in order to decode linear, non-linear and discontinuous spread spectrum RF signals.

A laser beam modulated with a broadband RF signal is optically processed to remove unwanted spectral components. An optical adaptive weighting function is introduced into the system to accommodate for the changing modulation conditions in the beam. The weighted beam is down-converted to recover the radio frequency signal.

Figure 1:
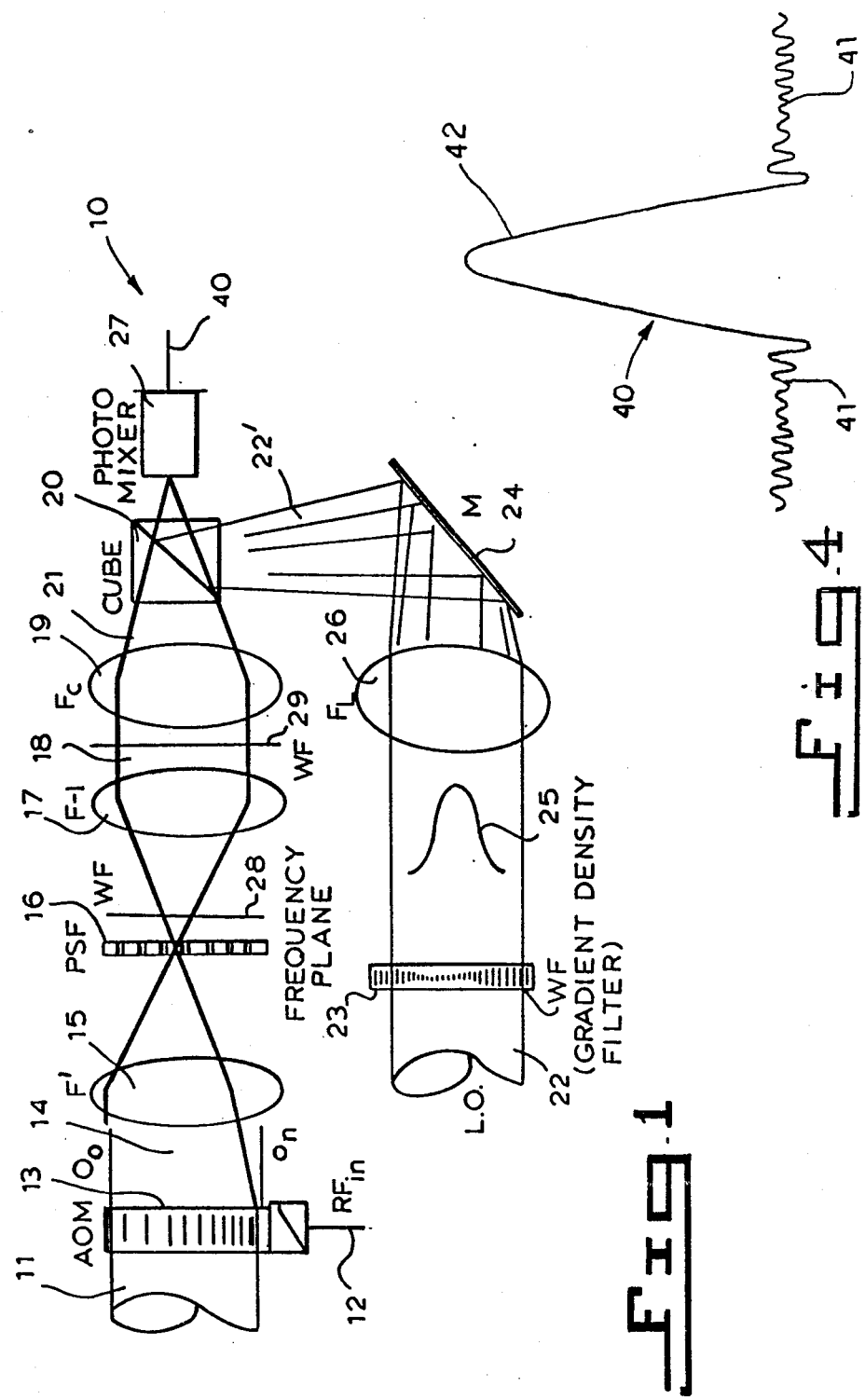
FIG. 1 is a schematic diagram of an embodiment of the spread spectrum decoder system of this invention.

The decoding system 10 of the invention is shown in FIG. 1. The decoding system 10 comprises a laser beam source 11 which is modulated with a radio frequency signal 12 by means of an acousto-optical modulator (AOM) 13.

The modulated beam 14 is then passed through a Fourier transform lens 15, a programmable spatial filter 16 and an inverse Fourier transform lens 17, as illustrated in FIG. 1. The Fourier lenses and spatial filter process the modulated beam 14 to remove unwanted spectral components, as taught in the aforementioned U.S. Pat. No. 4,522,466; the teachings of which are meant to be incorporated herein by way of reference.

The processed beam 18 is then passed through a compression lens 19 which focuses the compressed beam 21 onto a beam combiner cube 20, which combines the processed and compressed beam 21 with a local oscillator beam 22' in which a weighted function 25 has been introduced by a gradient density filter 23. The local oscillator beam 22 passes through the gradient density filter 23 which introduces the weighting function 25 and the weighted beam 22' is focused onto a mirror 24 by means of a lens 26. The mirror 24 directs the weighted beam 22' to the combiner cube 20, and the two beams 21 and 22' are combined and passed to a photomixer 27. The photomixer 27 down converts the combined beams to recover the RF signal.

Other weighting functions 28 and 29 can be introduced into the modulated beam 18, as shown.

The weighting and compressing of the modulated beam provides the characteristics necessary to properly decode broad band RF signals, such as a chirp signal.

Figure 2:
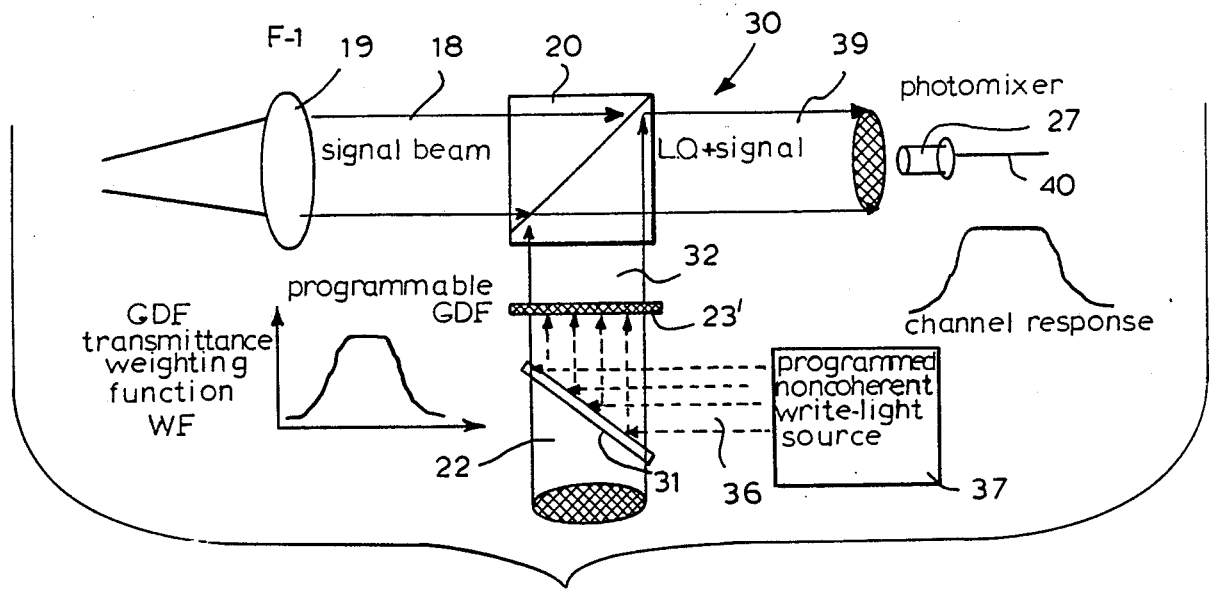
FIG. 2 is a schematic diagram of another embodiment of the weighting function apparatus of FIG. 1.

The decoding system 10 of FIG. 1 may be further modified to accommodate and decode non-linear and discontinuous RF signals by means of the alternate system embodiment 30 shown in FIG. 2.

The processed beam 18 which has passed through the inverse Fourier transform lens 17 is then combined with a programmed local oscillator beam 32 by combiner cube 20.

A local oscillator beam 22 passes through a mirror 31 to a programmable gradient density filter 23'. The local oscillator beam 22 is combined with a programmed non-coherent write-light beam 36 which originates at source 37 and is reflected into the path of oscillator beam 22 by means of beam splitter 31. The resultant programmed oscillator beam 32 combines with processed beam 18, as aforementioned, via combiner cube 20, which feeds the combined beams 39 to photomixer 27.

Figure 3:
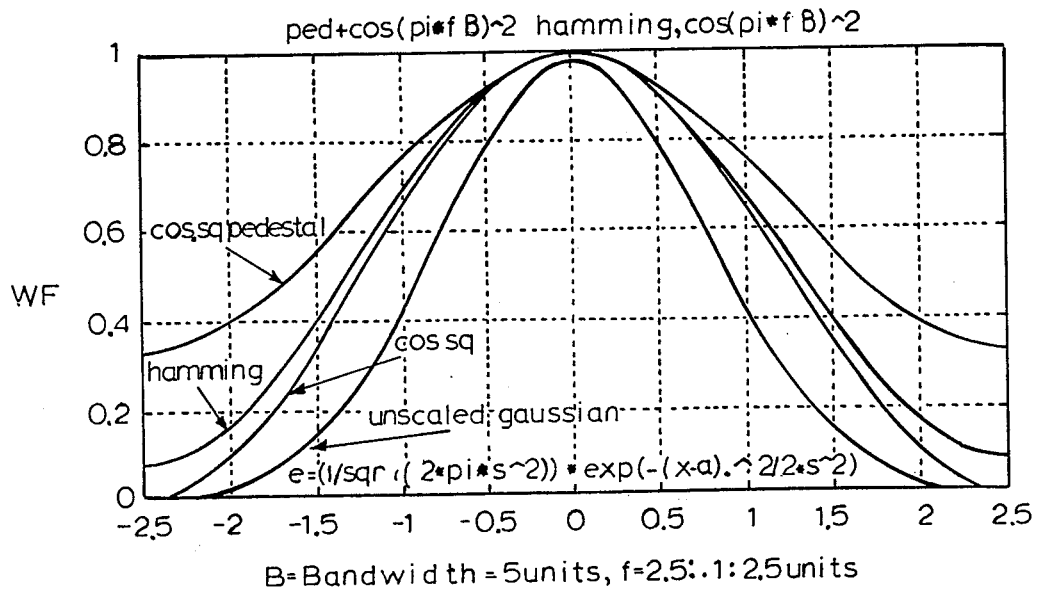
FIG. 3 is a graphical representation of various weighting functions which can be used in the inventive system of FIGS. 1 and 2.

FIG. 3 illustrates some of the weighting functions that can be impressed upon the local oscillator beam 22. The weighting function can be any desired function as an example given by one of the following: cosine square, cosine square with pedestal, hamming and unscaled Gaussian functions.

The gradient density filter 23 or 23' can have a filter material selected from photochromic, liquid crystal, magnetic, optic or photorefractive material, such as lithium niobate.

The write beam 36 has a different wavelength than the laser beam.

A waveform diagram of the compressed decoded signal 40 from photomixer 27 is depicted in FIG. 4.

It will be noted from the signal 40 that the sidelobes 41 have been compressed, so that the main signal pulse 42 is clearly and unambiguously discernible.

Having thus described the invention, what is desired to be protected by Letters Patent is presented by the subsequently appended claims.

What is claimed is:

1. An optical spread spectrum decoding system for decoding linear, non-linear and discontinuous radio frequency signals, said decoding system comprising:
   a source of substantially coherent collimated optical radiation;
   means defining an optical path for said radiation;
   modulating means for modulating said radiation with a broadband radio frequency signal;
   optical processing means for optically processing the modulated radiation to remove unwanted spectral components;
   optical compression means for compressing the optically processed radiation;
   weighting function means disposed along said optical path for introducing a weighting function into said optical radiation to accommodate the decoding of the signal to changes in said modulated radiation; and
   down-converting means for down-converting said optically processed and compressed radiation to provide a decoded radio frequency signal, said down-converting means including a local oscillator beam having said weighting function introduced thereinto, said weighting function means compressing a gradient density filter introducing one of the groups of functions consisting of cosine squared, cosine squared with pedestal, hamming and unscaled Gaussian functions.

2. The optical spread spectrum decoding system of claim 1, wherein said means for optically processing said modulated radiation includes a Fourier transform lens disposed along said optical path followed by a programmable spatial filter, followed by an inverse Fourier transform lens.

3. The optical spread spectrum decoding system of claim 2, wherein said weighting function is introduced in a frequency plane of said optical processing means by said weighting function means.

4. The optical spread spectrum decoding system of claim 2, wherein said weighting function means is disposed between said inverse Fourier transform lens and said optical compression means.

5. The optical spread spectrum decoding system of claim 2, wherein said weighting function means is disposed between said spatial filter and said inverse Fourier transform lens.

6. The optical spread spectrum decoding system of claim 1, wherein said optical processing means includes means for optically notching said unwanted spectral components from said modulated radiation.

7. The optical spread spectrum decoding system of claim 1, wherein said weighting function means introduces said weighting function in an optical plane.

8. The optical spread spectrum decoding system of claim 1, wherein said down-converting means further includes means for combining said local oscillator beam with said processed and compressed radiation and a photomixer for converting said radiation into a radio frequency signal.

9. A method of optically decoding non-linear and discontinuous radio frequency signals, said method comprising the steps of:

(a) optically processing optical radiation modulated with a broadband radio frequency signal to remove unwanted spectral components;

(b) introducing an adaptive optical weighting function for accommodating changing modulated conditions in said optical radiation, said weighting function being introduced via a gradient density filter, said gradient density filter introducing one of the group of functions consisting of cosine squared, cosine squared with pedestal, hamming and unscaled Gaussian functions; and (c) down-converting said optical radiation, including combining the processed optical radiation with a local oscillator beam, to recover said radio frequency signal.

10. The method of claim 9, wherein said introduction of said weighting function in accordance with step (b) includes providing a weighting function in a frequency plane.

11. The method of claim 9, wherein said introduction of said weighting function in accordance with step (b) includes providing a weighting function in an optical plane.

12. The method of claim 9, further comprising the step of compressing said processed optical radiation.

13. The method of claim 12, further comprising the step of combining said processed and compressed optical radiation with said local oscillator beam.

14. The method of claim 13, wherein said weighting function is introduced into said local oscillator beam.

15. The method of claim 9, wherein said optically processed radiation comprises filtering said modulated radiation between complementary Fourier transformations.

16. An optical system for decoding a spread spectrum signal, said optical system comprising:
means for optically processing optical radiation modulated with a radio frequency signal to remove unwanted spectral components;
optical weighting function means for introducing an adaptive optical weighting function into the modulated optical radiation; and
down-converting means for down-converting the optical radiation to recover said radio frequency signal, said down-converting means comprising a local oscillator beam and means for combining said local oscillator beam with the processed optical radiation, and optical weighting function means comprising a gradient density filter for introducing one of the group of functions consisting of cosine squared, cosine squared with pedestal, hamming and unscaled Gaussian functions.

17. The optical system of claim 16, wherein said means for introducing said weighting function introduces said weighting function in a frequency plane.

18. The optical system of claim 16, wherein said means for introducing said weighting function introduces said weighting function in an optical plane.

19. The optical system of claim 16, further comprising optical compression means for compressing said processed radiation.

20. The optical system of claim 16, wherein said optical processing means comprises a Fourier transform lens followed by a programmable spatial filter, followed by an inverse Fourier transform lens.

21. An optical spread spectrum decoding system for decoding linear, non-linear and discontinuous radio frequency signals, said decoding system comprising:
a source of substantially coherent collimated optical radiation;
means defining an optical path for said radiation;
modulating means for modulating said radiation with a broadband radio frequency signal;
optical processing means for optically processing the modulated radiation to remove unwanted spectral components;
optical compression means for compressing the optically processed radiation;
weighting function means disposed along said optical path for introducing a weighting function into said optical radiation to accommodate the decoding of the signal to changes in said modulated radiation;
down-converting means for down-converting said optically processed and compressed radiation to provide a decoded radio frequency signal, said down-converting means including a local oscillator beam having said weighting function introduced thereinto, said weighting function means comprising a gradient density filter introducing one of the group of functions consisting of cosine squared, cosine squared with pedestal, hamming and unscaled Gaussian functions; and
means providing a noncoherent write-light beam for controlling and modulating said gradient density filter.

22. An optical spread spectrum decoding system for decoding linear, non-linear and discontinuous radio frequency signals, said decoding system comprising:
a source of substantially coherent collimated optical radiation;
means defining an optical path for said radiation;
modulating means for modulating said radiation with a broadband radio frequency signal;
optical processing means for optically processing the modulated radiation for removing unwanted spectral components;
optical compression means for compressing the optically processed radiation;
weighting function means disposed along said optical path for introducing a weighting function into said optical radiation for accommodating the decoding of the signal to changes in said modulated radiation;
down-converting means for down-converting said optically processed and compressed radiation to provide a decoded radio frequency signal, said down-converting means including a local oscillator beam having said weighting function introduced thereinto, said weighting function means comprising a gradient density filter introducing one of the group of functions consisting of cosine squared, cosine square with pedestal, hamming and unscaled Gaussian functions and consisting of a filter material selected from a group consisting of photochromic, liquid crystal and photorefractive materials.

23. A method of optically decoding non-linear and discontinuous radio frequency signal, said method comprising the steps of:
(a) optically processing optical radiation modulated with a broadband radio frequency signal to remove unwanted spectral components;
(b) introducing an adaptive optical weighting function for accommodating changing modulated conditions in said optical radiation, said weighting function being introduced via a gradient density filter, said gradient density filter introducing one of the group of functions consisting of cosine squared, cosine squared with pedestal, hamming and unscaled Gaussian functions;

(c) down-converting said optical radiation, including combining the processed optical radiation with a local oscillator beam, to recover said radio frequency signal; and (d) controlling and modulating the gradient density filter via noncoherent write-light beam.

24. A method optically decoding non-linear and discontinuous radio frequency signals, said method comprising the steps of:

(a) optically processing optical radiation modulated with broadband radio frequency signal to remove unwanted spectral components;

(b) introducing an adaptive optical weighting function for accommodating changing modulated conditions in said optical radiation, said weighting function being introduced via a gradient density filter, said gradient density filter introducing one of the group of functions consisting of cosine squared, cosine squared with pedestal, hamming and unscaled Gaussian functions and consisting of a filter material selected from a group consisting of photochromic, liquid crystal and photorefractive materials; and (c) down-converting said optical radiation, including combining the processed optical radiation with a local oscillator beam, to recover said radio frequency signal.

25. An optical system for decoding a spread spectrum signal, said optical system comprising:

means for optically processing optical radiation modulated with a radio frequency signal to remove unwanted spectral components;

optical weighting function means for introducing an adaptive optical weighting function into the modulated optical radiation;

down-converting means for down-converting the optical radiation to recover said radio frequency signal, said down-converting means comprising a local oscillator beam and means for combining said local oscillator beam with the processed optical radiation, said optical weighting function means comprising a gradient density filter for introducing one of the group of functions consisting of cosine squared, cosine squared with pedestal, hamming and unscaled Gaussian functions; and means providing a noncoherent write-light beam for controlling and modulating said gradient density filter.

26. An optical system for decoding a spread spectrum signal, said optical system comprising:

means for optically processing optical radiation modulated with a radio frequency signal to remove unwanted spectral components;

optical weighting function means for introducing an adaptive optical weighting function into the modulated optical radiation; and down-converting means for down-converting the optical radiation to recover said radio frequency signal, said down-converting means comprising a local oscillator beam and means for combining said local oscillator beam with the processed optical radiation, said optical weighting function means comprising a gradient density filter for introducing one of the group of functions consisting of cosine squared, cosine squared with pedestal, hamming and unscaled Gaussian functions, said gradient density filter consisting of a filter material selected from a group consisting of photochromic, liquid crystal and photorefractive materials.

* * * * *